United States Patent [19]

Page

[11] 4,216,485
[45] Aug. 5, 1980

[54] OPTICAL TRANSISTOR STRUCTURE

[75] Inventor: Derrick J. Page, Murrysville, Pa.

[73] Assignee: Westinghouse Electric Corp., Pittsburgh, Pa.

[21] Appl. No.: 942,579

[22] Filed: Sep. 15, 1978

[51] Int. Cl.$^2$ .............................................. H01S 33/19
[52] U.S. Cl. ...................................... 357/19; 357/18; 331/94.5 H
[58] Field of Search .......................... 357/18, 17, 19; 331/94.5 H

[56] References Cited

U.S. PATENT DOCUMENTS

| | | | |
|---|---|---|---|
| 3,290,539 | 12/1966 | LaMorte | 313/114 |
| 3,881,113 | 4/1975 | Rideout | 250/551 |
| 3,958,265 | 5/1976 | Charmakadze | 357/17 |
| 4,053,914 | 10/1977 | Goodwin | 357/17 |
| 4,092,614 | 5/1978 | Sakuma | 331/94.5 H |

Primary Examiner—Martin H. Edlow
Attorney, Agent, or Firm—B. W. Mc Gee

[57] ABSTRACT

An optical power transistor comprises a gallium arsenide laser diode disposed on the surface of a semiconductor diode. The ends of the laser diode are angled so that the laser radiation generated in the Fabry-Perot cavity is directed onto the surface of the semiconductor diode for creating electron hole pairs therein and thereby creating electrical current therethrough. In another embodiment, prism means are disposed on the ends of the laser diode for directing the laser radiation onto the semiconductor diode.

11 Claims, 5 Drawing Figures

OPTICAL TRANSISTOR STRUCTURE

BACKGROUND OF THE INVENTION

1. Field of the Invention

This invention relates to semiconductor optical devices, and, in particular, to semiconductor optical transistors having a laser diode integrated therewith.

2. Description of the Prior Art

Typically, optical transistors are operated by generating radiation in a physically separate device such as a laser or other radiation or light source and coupling the light to the appropriate region of the transistor by a light pipe or some other such fiber optics means, each of which elements has a different refractive index. A number of significant optical losses due to reflections occur in the transmitting of light through substances or materials having different refractive indexes.

A method and apparatus is needed for reducing or eliminating the reflection losses using discrete elements or devices due to differing refractive indexes.

SUMMARY OF THE INVENTION

A semiconductor optical device is provided which includes a laser means disposed on the surface of a semiconductor region. Reflecting means is disposed on the laser means and on the semiconductor region in order to reflect radiation generated in the laser means onto the semiconductor region for creating electron hole pairs therein.

More particularly, a gallium arsenide laser diode is disposed on the surface of a semiconductor diode. The ends of the laser means are ground or otherwise shaped such that, when current is applied thereto, a laser light generated and emitted from a Fabry-Perot cavity in the gallium arsenide laser diode is reflected onto the surface of the semiconductor diode. The resulting angled ends of the laser diode also act to maintain the lasing action in the Fabry-Perot cavity in the laser diode by reflecting a portion of the light emitted from the cavity back into the cavity. Alternatively, an intermediate layer of transparent and insulating material of appropriate thickness can be inserted between the two diodes to provide the appropriate degree of reflection and also provide a measure of electrical insulation.

In another embodiment, the ends of the laser diode are parallel to each other and a prism is disposed on each of them. The face of the prism is arranged such that the light generated and emitted from the laser diode cavity is reflected onto the semiconductor surface.

Particular advantages accruing from the integrated nature of the invention are improved thermal and optical coupling of the laser and semiconductor diodes so as to provide a more efficient and reliable optical transistor.

DESCRIPTION OF THE PREFERRED EMBODIMENT

Figure 1:
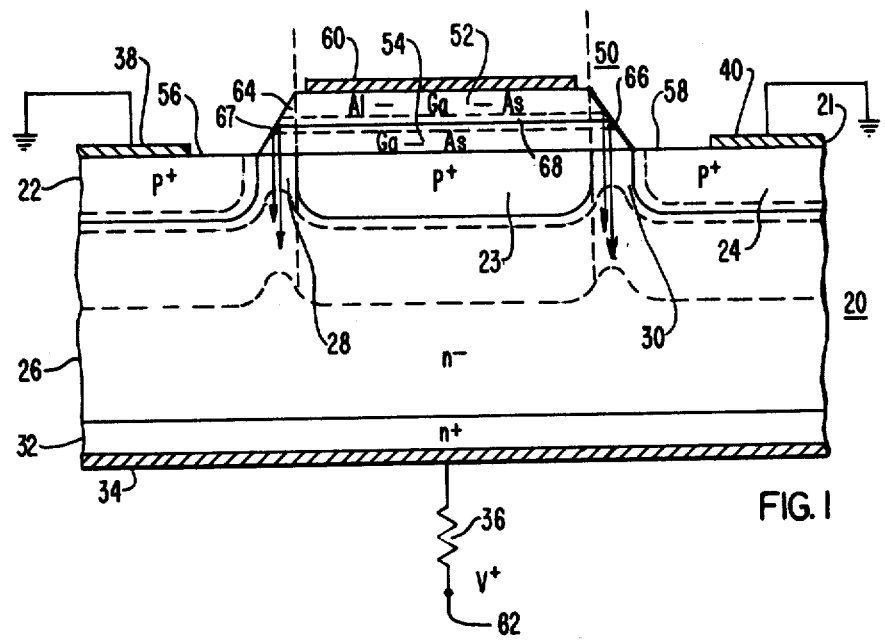
FIGS. 1, 4 and 5 show cross-sectional views along the lines I—I of FIG. 2 of alternative embodiments of an optical transistor according to the present invention.

FIG. 1 is a sectional view of an optical transistor according to the teachings of the present invention. A semiconductor diode 20 having a top surface 21 includes regions 22, 23, and 24 having P-type conductivity. The impurity concentration of the P-type regions should be high in order to facilitate current flow and is preferably $10^{18}$ acceptor atoms/cm$^3$, but can be between $10^{16}$ acceptor atoms/cm$^3$ and $10^{21}$ acceptor atoms/cm$^3$. The semiconductor diode 20 also includes N-type semiconductor region 26 having a low impurity concentration for maintaining and electric field therethrough. The impurity concentration of the region 26 is such that the region behaves as an N$^-$ or i region, and is preferably $10^{16}$ donor atoms/cm$^3$, but can be between $10^{14}$ donar atoms/cm$^3$ and $10^{16}$ donor atoms/cm$^3$. The region 26 includes portions 28 and 30 which extend to the surface 21 of the semiconductor diode 20. A semiconductor region 32 and an anode electrode 34 are included in the semiconductor diode 20 for facilitating the providing of current in the diode 20 to a load 36. The region 32 has a high impurity concentration in order to facilitate on the contact between N$^-$ region 26 and the anode electrode 34. The impurity concentration of the region 32 is such that it behaves as an N$^+$ semiconductive region, and is preferably $10^{18}$ donor atoms/cm$^3$, but can be between $10^{16}$ donor atoms/cm$^3$ and $10^{21}$ donor atoms/cm$^3$. The semiconductor diode 20 also includes cathode electrodes 38 and 40 disposed on the P$^{30}$ regions 22 and 24, respectively.

A laser diode 50 is disposed on the surface 21 of the semiconductor diode 20 and includes a layer 52 of aluminum gallium arsenide disposed upon a layer 54 of gallium arsenide and a Fabry-Perot cavity 68 created therebetween. The layer 54 is disposed upon the surface 21 of the semiconductor diode 20 completely covering the P$^+$ region 23 and the portions 28 and 30 of the N$^-$ region 26. The laser diode 50 is spaced apart from the cathode electrodes 38 and 40 by surface areas 56 and 58, respectively, of the semiconductor surface 21. The laser diode 50 also includes a metal electrode 60 disposed upon the aluminum gallium arsenide layer 52.

Figure 2:
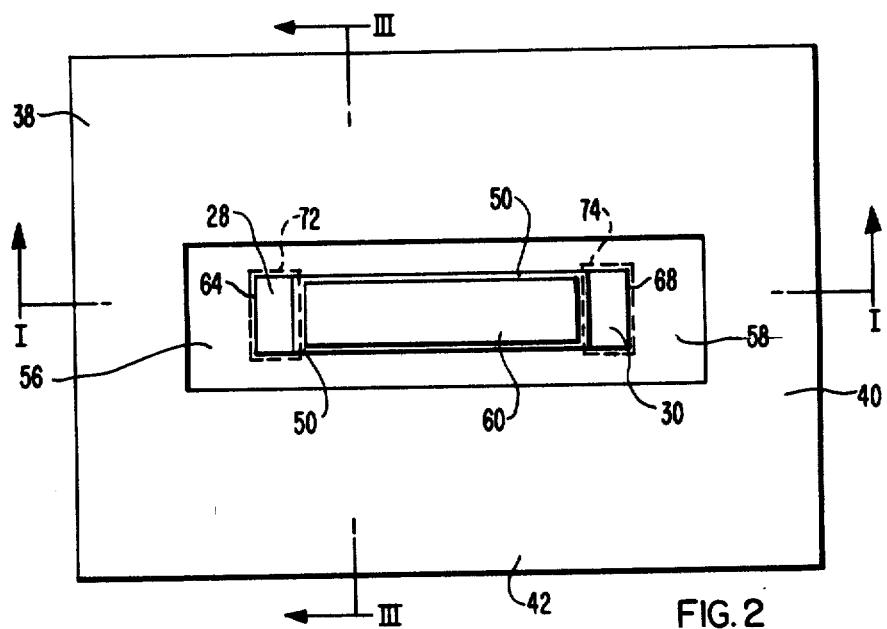
FIG. 2 shows a top view of an optical transistor according to the present invention.

FIG. 2 shows a top view of the transistor shown in FIG. 1 wherein like reference characters designate corresponding parts of FIG. 1. FIG. 1 is actually a cross-section of the transistor taken along the lines I—I. The area inside the dashed lines at 72 and 74 comprises the N$^-$ regions 28 and 30, respectively. And, the area outside the lines at 72 and 74 comprises the P$^+$ regions 22, 23, and 24. The cathode electrodes 38 and 40 are really one contiguous metal layer 42 on the surface 21 of the semiconductor diode 20.

Figure 3:
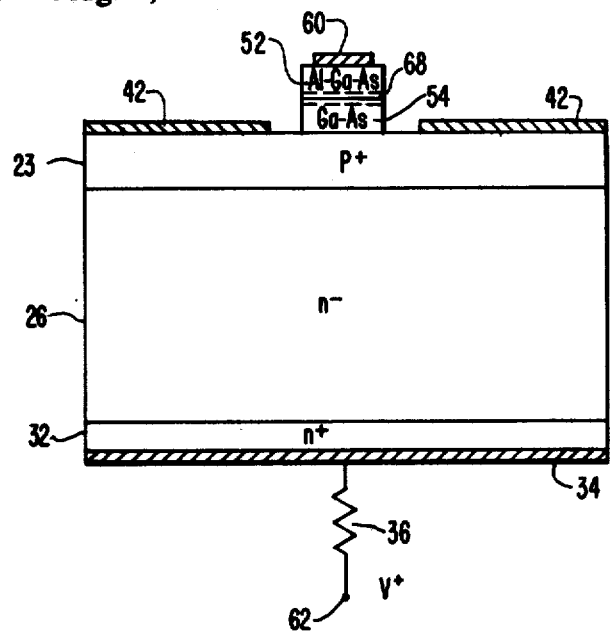
FIG. 3 shows a cross-sectional view of an optical transistor according to the present invention along the lines III—III of FIG. 2.

FIG. 3 shows a cross-sectional view of the transistor in FIG. 2 taken along the lines III—III wherein like reference characters designate corresponding parts of FIGS. 1 and 2.

In operation of the optical device of FIG. 1, the semiconductor diode 20 is reverse biased by coupling the cathode electrodes 38 and 40 to ground and coupling the anode electrode 34 to a positive potential 62 through the load 36. Under this reverse biased condition, the semiconductor diode 20 is in the blocking state and there is no current flow in the load 36. When current is applied to the laser diode electrode 60, electromagnetic radiation is generated, preferably in the infrared region. The radiation generated in the laser cavity 68 is reflected from the ends 64 and 66 of the semiconductor section of the laser diode into the portions 28 and 30, respectively, of the N− region 26 for generating electron hole pairs in the region 26. Some of the radiation is reflected from the surface 21 of the semiconductor diode 20 back into the Fabry-Perot cavity 68 in order to maintain the lasing action therein. Edges 64 and 66 of the laser diode 50 are inclined at an angle with the surface 21. The angle is preferably 45° so that the maximum radiation will be reflected toward the surface 26. However, angles deviating from 45° can be used if maximum reflection toward the surface 21 is not required. The edges 64 and 66 are generally situated over the regions 28 and 30, respectively and may be variously situated thereover as long as all of the laser light or radiation generated in the Fabry-Perot cavity 68 is reflected into the regions 28 and 30. It is preferred, however, that the edges 64 and 66 of the laser diode 50 completely cover the regions 28 and 30 while not extending into the areas over the P+ regions 22 and 24. The dimension of the laser diode 50 (e.g. height, θ), the p+ regions 22-24, and the N− regions 28 and 30 are all interrelated. For example, the regions 28 and 30 should be as narrow as possible at the surface 21 so that only low voltage equipotential lines if any at all reach the surface 21. If high voltage equipotential lines reach the surface 21, large lateral electric fields could cause device instability and breakdown. The electrical insulation hereinafter described with reference to FIG. 4 avoids this breakdown by passivating the surface. However, the regions 28 and 30 must be wide enough at the surface 21 so that all of the infrared laser light reflected from edges 64 and 66 is reflected into the N− regions 28 and 30 and none onto one of the P+ regions 22, 23, or 24. The N− regions 28 and 30 are typically on the order of 4-6 mils wide. For any given angle, elementary trigonometry and algebra will yield the required height and other dimensions for the diode 50, for example.

The electric field created in the reverse biased semiconductor diode 20 propels the electron in each electron hole pair through the two N-type regions 26 and 32 and thereby provides a current to the load 36. High switching speed is made possible by having excess carriers generated only in the high drift field N− region 26 so opposed to the low field P+ regions 22, 23, and 24. When current is removed from the laser diode electrode 60, the lasing action is discontinued, the semiconductor diode 20 returns to the blocking state and current then ceases to flow in the load 36.

A particular advantage accruing from the teachings of the present invention is improved thermal stability due to a negative thermal feedback. The laser diode 50 is situated on the surface 21 such that a large portion of its surface area contacts the surface 21 allowing improved dissipation of heat from the laser diode 50 through the silicon in the semiconductor diode 20 which is a good thermal conductor. Excessive thermal buildup in the laser diode 50 due, for example, to current passing therethrough can severally reduce its operating efficiency, i.e., reduce photon emission and thus reduce current conduction. Integrating the laser diode 50 and the semiconductor diode 20 according to the teachings of the present invention, provides improved thermal coupling by sinking any excessive thermal buildup through the diode 20. Improved optical coupling is also an inherent advantage of the teachings due to the integrated nature of the invention since the laser light generated in laser diode 50 is not passed through several materials or substances having different refractive indexes which can reduce the intensity of the laser light.

Figure 4:
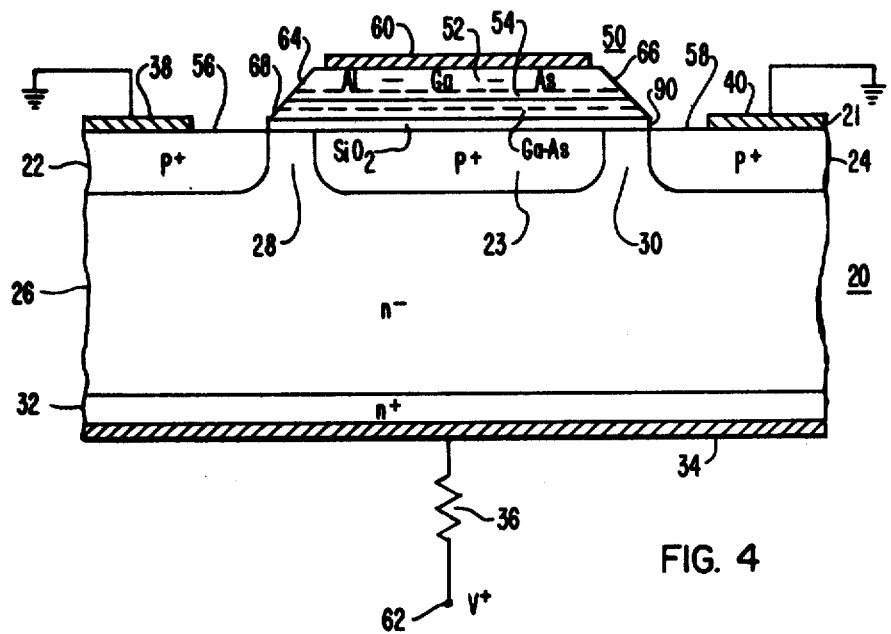

FIG. 4 shows an embodiment of the present invention similar to that shown in FIG. 1, further including in FIG. 4, a layer 90 of transparent and electrically insulating material such as silicon oxide of appropriate thickness disposed on the surface 21 between the laser diode 50 and the semiconductor diode 20 to provide electrical insulation between the two diodes 50 and 20, and to provide additional reflection of the radiation or laser light generated in the laser diode 50 for maintaining lasing action therein.

Figure 5:
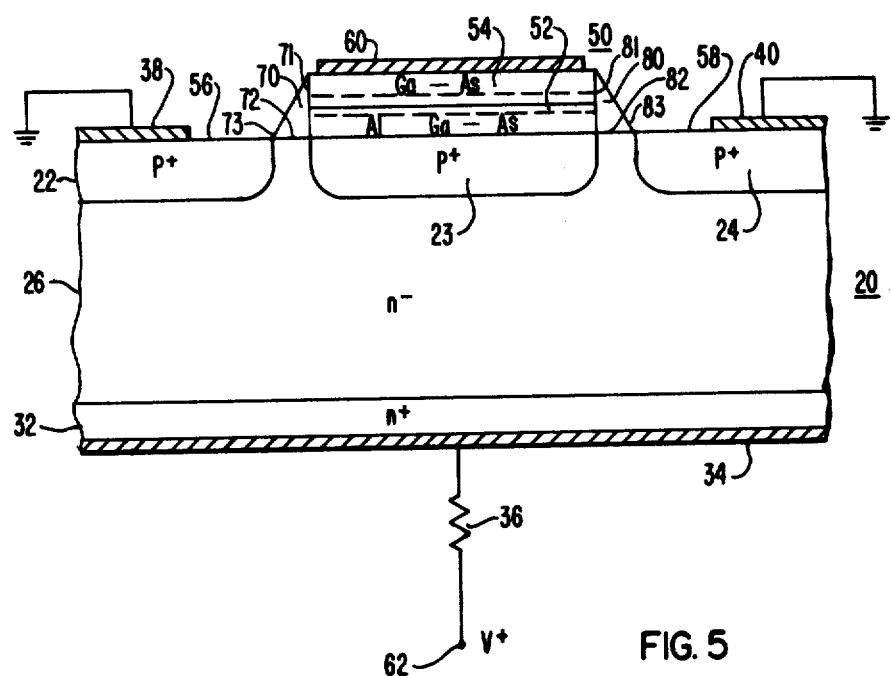

FIG. 5 shows a cross-section such as is shown in FIG. 1 of another embodiment of an optical transistor according to the teachings of the present invention wherein similar reference characters refer to similar elements as designated in FIG. 1. The positions of the gallium arsenide layer 54 and the aluminum gallium arsenide layer 52 are reversed from their respective positions in FIG. 1, but the operation of the laser diode 50 is the same as hereinbefore described with reference to FIG. 1. A prism 70 having a side 71 and a side 72 and a face 73 is disposed on one end of the laser diode 50 for reflecting light generated in the laser diode onto the portion 28 of the semiconductor 20. A prism 80 having sides 81 and 82 and having a face 83 is disposed on the other end of the laser diode 50 for reflecting light generated therein onto the portion 30 of the semiconductor diode 20.

It will be appreciated by those skilled in the art that the present invention may be carried out in various ways and may take various forms and embodiments other than the illustrative embodiments heretofore described. For example, it is not essential that the laser diode 50 have two ends 64 and 66 or two prisms 70 and 80 but may have only one angled end or prism or other such means for performing the function of directing the laser light onto the surface 21. And, it is not essential that the region 26 have regions 28 and 30 extending to the surface 21. The regions 22, 23 and 24 may be one contiguous layer of semiconductor material such that the region 26 does not extend to the surface 21.

Since still other structural and methodological variations are possible, it is to be understood that the scope of the invention is not limited by the details of the foregoing description but will be defined in the following claims.

What I claim is:

1. A semiconductor optical device comprising:
    a silicon semiconductor region;
    energy producing means disposed on said semiconductor region for generating and emitting radiation in response to an electrical signal, said energy means having an edge;
    means for confining said radiation within said energy means; and
    reflecting means on the end of said energy producing means and on said semiconductor region for reflecting the radiation from said laser means onto said semiconductor region for creating electron hole pairs.

2. An integrated optical power transistor comprising:
    a semiconductor diode including a first semiconductor region having a first conductivity type and a second semiconductor region having a second conductivity type;

means for providing current in said semiconductor diode to a load;

means for biasing said semiconductor diode;

energy producing means on the first semiconductor region of said semiconductor diode for emitting coherent radiation in response to an electrical signal;

means for confining said radiation within said energy means; and first reflecting means coupled to said energy producing means and disposed on an area of the surface of the first semiconductor region of said semiconductor diode for reflecting said light emitted from said laser means through said first reflecting means toward said semiconductor diode for creating electron hole pairs therein and thereby creating electrical current therethrough.

3. An integrated optical power transistor according to claim 2 further including:

second reflecting means for reflecting a portion of the light emitted from said laser means back into said laser means for maintaining lasing action therein.

4. An integrated optical power transistor according to claim 2 wherein the means for providing current in said semiconductor diode to a load includes:

a third semiconductor region disposed on said second semiconductor region, said third semiconductor region having said second conductivity type and a third impurity concentration;

an anode electrode disposed on said third semiconductor region; and a cathode electrode disposed on a portion of the first semiconductor region of said semiconductor diode not occupied by said laser means.

5. An optical transistor according to claim 2 wherein portions of the second semiconductor region of said semiconductor diode extends to the surface of said semiconductor diode thereby isolating portions of the first semiconductor region of said semiconductor diode, said portions of the second semiconductor region being directly under and corresponding in area to said first reflecting means.

6. An integrated optical power transistor according to claim 3 wherein said first reflecting means includes an edge of said laser means and wherein said second reflecting means includes a layer of transparent insulating material between said laser and semiconductor diodes.

7. An integrated optical power transistor according to claim 3 wherein said first and second reflecting means includes a prism.

8. An optical power transistor according to claim 7 further including a layer of silicon oxide between said laser diode and said semiconductor diode for electrically insulating the two diodes, and for providing additional reflection of said infrared laser radiation back into said Fabry-Perot cavity in order to maintain the lasing action therein.

9. An integrated optical power transistor according to claim 8 wherein said first reflecting means includes an edge of the first section of said laser diode.

10. An integrated optical power transistor according to claim 8 wherein said reflecting means includes a prism having a first prism side coupled to said first section, a second prism side coupled to the top surface of said semiconductor diode, and a face opposite said first and second prism sides, said face making a forty-five degree angle with the top surface of said semiconductor diode.

11. An integrated optical power transistor comprising:

a semiconductor diode having top and bottom surfaces and including a P-type region adjacent to said top surface, a first N-type region adjacent to said P-type region and forming a P-N junction therewith, portions of said first N-type region extending to said top surface through said P-type region and thereby isolating portions of said P-type region, a second N-type region between and adjacent to said first N-type region and said bottom surface, an anode electrode disposed on said bottom surface, a cathode electrode disposed on selected of the isolated portions of said P-type region, said first N-type region having an impurity concentration between $10^{14}$ donor atoms/cm$^3$ and $10^{16}$ donor atoms/cm$^3$, said P-type region having an impurity concentration between $10^{16}$ acceptor atoms/cm$^3$ and $10^{21}$ acceptor atoms/cm$^3$, said second N-type region having an impurity concentration between $10^{16}$ donor atoms/cm$^3$ and $10^{21}$ donor atoms/cm$^3$;

a laser diode having first and second sections, said first section including a layer of gallium arsenide disposed on the top surface of said semiconductor diode and a layer of aluminum gallium arsenide disposed on said layer of gallium arsenide for creating a Fabry-Perot cavity parallel to the top surface of said semiconductor diode from which infrared laser radiation is emitted, reflecting means on each end of said first section angled at a forty-five degree angle for reflecting the infrared laser radiation emitted from said Fabry-Perot cavity onto the portions of said first N-type region extending to the top surface of said semiconductor diode, said second section including an electrode disposed on said layer of aluminum gallium arsenide for facilitating the flow of current through said laser diode.

* * * * *